(12) United States Patent
Endo

(10) Patent No.: US 8,071,464 B2
(45) Date of Patent: Dec. 6, 2011

(54) MANUFACTURING METHOD FOR LIGHT EMITTING DEVICE

(75) Inventor: Tomohiro Endo, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/968,851

(22) Filed: Dec. 15, 2010

(65) Prior Publication Data

US 2011/0159621 A1 Jun. 30, 2011

(30) Foreign Application Priority Data

Dec. 25, 2009 (JP) .................................. 2009-294419

(51) Int. Cl.
*H01L 21/00* (2006.01)

(52) U.S. Cl. .......................... 438/463; 438/460; 438/462

(58) Field of Classification Search .................. 438/463, 438/460, 462
See application file for complete search history.

(56) References Cited

U.S. PATENT DOCUMENTS

| 6,902,990 B2 * | 6/2005 | Gottfried et al. ............... 438/463 |
| 2007/0176181 A1 * | 8/2007 | Kusunoki ........................ 257/79 |

FOREIGN PATENT DOCUMENTS

| JP | 10-056203 | 2/1998 |
| JP | 10-305420 | 11/1998 |
| JP | 2002-192370 | 7/2002 |

* cited by examiner

*Primary Examiner* — Ha Tran T Nguyen
*Assistant Examiner* — Aaron Dehne
(74) *Attorney, Agent, or Firm* — Greer, Burns & Crain, Ltd.

(57) ABSTRACT

A light emitting device manufacturing method including the steps of corrugatedly scanning a laser beam along a plurality of division lines formed on a light emitting device wafer having a sapphire substrate layer and a light emitting layer to apply the laser beam to the sapphire substrate layer, thereby performing laser processing for the sapphire substrate layer and next applying an external force to a processed locus formed along each division line by the above laser processing to thereby divide the light emitting device wafer into a plurality of light emitting devices. The sapphire layer of each light emitting device has side surfaces whose horizontal sectional shape is a corrugated shape. Accordingly, the number of total reflections on the side surfaces of the sapphire layer can be reduced to thereby achieve efficient emergence of light from the sapphire layer.

1 Claim, 12 Drawing Sheets

MANUFACTURING METHOD FOR LIGHT EMITTING DEVICE

BACKGROUND OF THE INVENTION

1. Field of the Invention

The present invention relates to a method of manufacturing a plurality of light emitting devices by dividing a light emitting device wafer having a sapphire substrate layer and a light emitting layer.

2. Description of the Related Art

In a semiconductor device fabrication process, a plurality of crossing division lines are formed on the front side of a substantially disk-shaped semiconductor wafer to thereby partition a plurality of regions where devices having electronic circuits such as ICs and LSIs are respectively formed. The semiconductor wafer is cut along the division lines to thereby divide the regions where the devices are formed from each other, thus obtaining the individual devices as a plurality of semiconductor chips. Further, a light emitting device wafer is provided by forming a plurality of light emitting devices such as light emitting diodes (LEDs) on the front side of a sapphire substrate. The light emitting device wafer is also cut along the division lines to obtain the individual light emitting devices such as light emitting diodes divided from each other, which are widely used in electronic/electric equipment (see Japanese Patent Laid-open No. Hei 10-56203, for example).

Cutting of such a wafer along the division lines is usually performed by using a cutting apparatus called a dicing saw. This cutting apparatus includes a chuck table for holding a workpiece such as a wafer, cutting means for cutting the workpiece held on the chuck table, and feeding means for relatively moving the chuck table and the cutting means. The cutting means includes a cutting tool having a spindle and a cutting blade mounted on the spindle, and a spindle unit having a driving mechanism for rotationally driving the spindle. In such a cutting apparatus, the cutting tool and the workpiece held on the chuck table are relatively moved and at the same time the cutting tool rotating at a speed of 20000 to 40000 rpm (revolutions per minute) is fed into the workpiece to thereby cut the workpiece.

As a method of dividing a light emitting device wafer composed of a sapphire substrate and a plurality of light emitting devices such as nitride semiconductors formed on the sapphire substrate, there has recently been proposed a method including the steps of applying a pulsed laser beam along the division lines formed on the wafer to thereby form a laser processed groove along each division line and next applying an external force to each laser processed groove to thereby break the wafer along each division line (see Japanese Patent Laid-open No. Hei 10-305420, for example). As another method of dividing this kind of wafer by laser processing, there has also been proposed a method including the steps of applying a pulsed laser beam having a transmission wavelength to the substrate of the wafer along the division lines in the condition where the focal point of the pulsed laser beam is set inside the substrate, thereby continuously forming a modified layer inside the substrate along each division line and next applying an external force to the substrate along a laser processed locus where the strength of the substrate is reduced by the formation of each modified layer, thereby breaking the wafer along each division line (see Japanese Patent No. 3408805, for example).

SUMMARY OF THE INVENTION

In a light emitting device having a sapphire layer and light emitting layer formed on the sapphire layer as disclosed in Japanese Patent Laid-open No. Hei 10-56203, light emitted from the light emitting layer enters the sapphire layer and then emerges from the sapphire layer to the air. The refractive index of sapphire is remarkably large, causing the following problem. When the light emitted from the light emitting layer and transmitted in the sapphire layer passes through the interface between the sapphire layer and an ambient layer (e.g., air) adjacent to the sapphire layer, the incident angle of the light incident on this interface must be less than a predetermined angle with respect to the normal to the interface (34.5° in the case of the interface between sapphire and air). Accordingly, when the light is incident on the interface at an angle greater than this predetermined angle, the light is totally reflected on the interface and does not emerge from the sapphire layer. That is, the totally reflected light is confined in the sapphire layer. Thus, the light emitted from the light emitting layer cannot be efficiently emerged from the sapphire layer, causing a reduction in luminance performance.

It is therefore an object of the present invention to provide a manufacturing method for a light emitting device which can efficiently emerge the light from the sapphire layer to exhibit a high luminance performance.

In accordance with an aspect of the present invention, there is provided a method of manufacturing a plurality of light emitting devices from a light emitting device wafer having a sapphire substrate layer and a light emitting layer by using a laser processing apparatus having holding means for holding said light emitting device wafer and laser processing means for applying a laser beam to said light emitting device wafer held by said holding means to perform laser processing, said method including a holding step of holding said light emitting device wafer by using said holding means in the condition where said light emitting layer of said light emitting device wafer is set on said holding means and said sapphire substrate layer of said light emitting device wafer is exposed; a laser processing step of scanning said laser beam along a plurality of division lines formed on said light emitting device wafer from the exposed side of said sapphire substrate layer so as to form a corrugated or zigzag shape along said division lines, thereby performing said laser processing; and a dividing step of applying an external force to a processed locus formed along each division line by said laser processing, thereby dividing said light emitting device wafer into said light emitting devices.

According to the present invention, a plurality of light emitting devices are manufactured so that each light emitting device has a structure that a light emitting layer is formed on the front side of a sapphire layer divided from the sapphire substrate layer of the light emitting device wafer. The sapphire layer of each light emitting device manufactured by the present invention is surrounded by a plurality of side surfaces formed by cutting the sapphire substrate layer of the wafer along the processed locus formed by the laser processing, and the sectional shape of each side surface of the sapphire layer is a corrugated or zigzag shape corresponding to the processed locus. Accordingly, although the incident angle of light incident on one side surface in the sapphire layer is greater than a critical angle to cause the total reflection on this side surface, the incident angle of the totally reflected light next incident on another side surface in the sapphire layer or further next incident on another side surface in the sapphire layer tends to become less than the critical angle and accordingly pass through this side surface. As a result, the quantity of light emerging from the sapphire layer can be increased.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A preferred embodiment of the present invention for dividing a light emitting device wafer to obtain a plurality of light emitting devices will now be described with reference to the drawings.

(1) Light Emitting Device Wafer

Figure 1A:
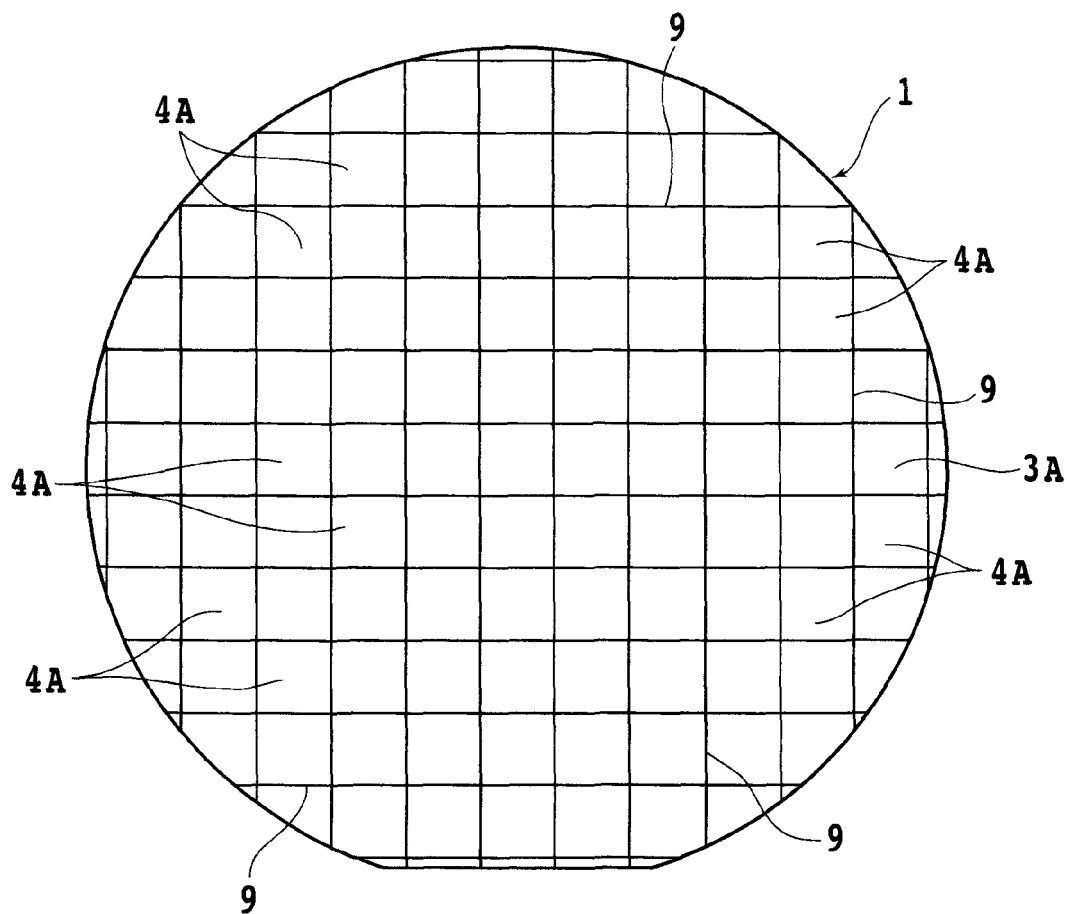
FIG. 1A is a plan view of a light emitting device wafer to be divided into a plurality of light emitting devices by a method according to a preferred embodiment of the present invention.
Figure 1B:
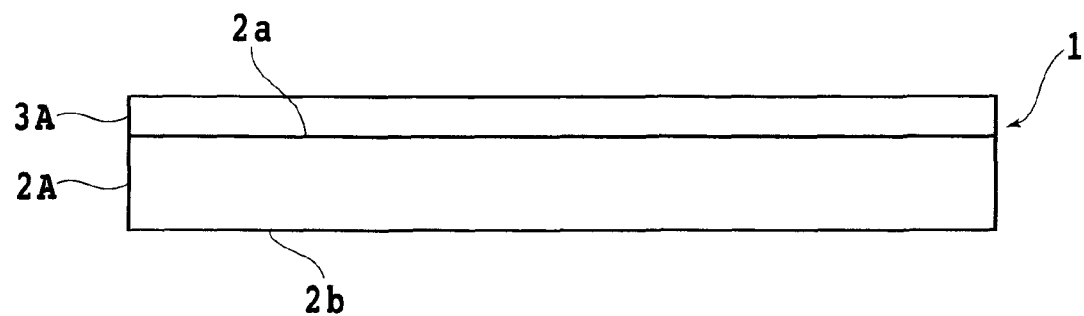
FIG. 1B is a side view of the light emitting device wafer shown in FIG. 1A.

FIG. 1A is a plan view of a light emitting device wafer 1 according to an embodiment of the present invention and FIG. 1B is a side view of the light emitting device wafer 1 shown in FIG. 1A. As shown in FIG. 1B, the light emitting device wafer 1 is composed of a disk-shaped sapphire substrate layer 2A having a front surface (upper surface as viewed in FIG. 1B) 2a and a back surface 2b and a light emitting layer 3A formed on the whole front surface 2a of the sapphire substrate layer 2A. As shown in FIG. 1A, a plurality of crossing straight division lines 9 are formed on the light emitting layer 3A to thereby partition a plurality of rectangular light emitting device areas 4A.

The light emitting layer 3A is of such a kind as well known in the art, and it is configured of a bandgap layer or a quantum well, for example. However, the configuration of the light emitting layer 3A is not limited. The light emitting layer 3A is formed of any compound containing the elements of the group III-V or the group II-VI. Examples of such a compound include indium gallium nitride (InGaN), gallium nitride (GaN), gallium arsenide (GaAs), gallium indium nitride (GaInN), aluminum gallium nitride (AlGaN), zinc selenide (ZnSe), zinc doped indium gallium nitride (InGaN:Zn), aluminum indium gallium phosphide (AlInGaP), and gallium phosphide (GaP). The light emitting layer 3A is formed by a light emitting device containing any of these compounds. Examples of such a light emitting device include a light emitting diode and an electroluminescence (EL) device.

Figure 2:
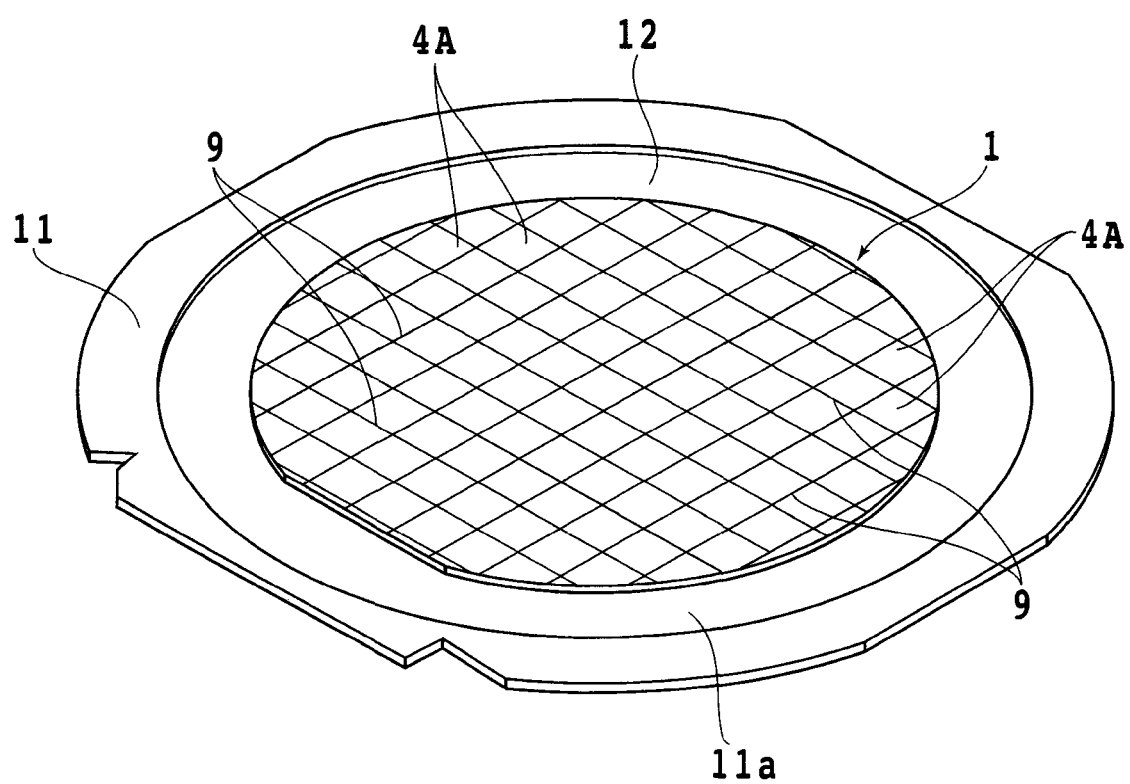
FIG. 2 is a perspective view of the light emitting device wafer supported through an adhesive tape to a frame to supply the wafer to a laser processing apparatus.

The manufacturing method according to this preferred embodiment includes the step of dividing the light emitting device wafer 1 along the division lines 9 to obtain the plural individual light emitting device areas 4A as light emitting devices. This method will be described later. The light emitting device wafer 1 is supplied to a laser processing apparatus 20 shown in FIG. 3 in the condition where it is supported through an adhesive tape 12 to an annular frame 11 in its inner opening 11a as shown in FIG. 2. By using the laser processing apparatus 20, the light emitting device wafer 1 is subjected to laser processing for the sapphire substrate layer 2A before dividing the wafer 1. The frame 11 is formed from a rigid metal plate such as a stainless steel plate. The adhesive tape 12 is composed of a base sheet such as a synthetic resin sheet and an adhesive layer formed on one side of the base sheet. The adhesive layer of the adhesive tape 12 is attached to the back side (lower side) of the frame 11 so as to close the inner opening 11a of the frame 11. The light emitting device wafer 1 is concentrically located in the inner opening 11a of the frame 11, and the light emitting layer 3A of the light emitting device wafer 1 is attached to the adhesive layer of the adhesive tape 12. The light emitting device wafer 1 is transported by handling the frame 11.

(2) Laser Processing Apparatus

The laser processing apparatus 20 for performing laser processing along the division lines 9 of the light emitting device wafer 1 will now be described with reference to FIG. 3.

(2-1) Configuration of Laser Processing Apparatus

Figure 3:
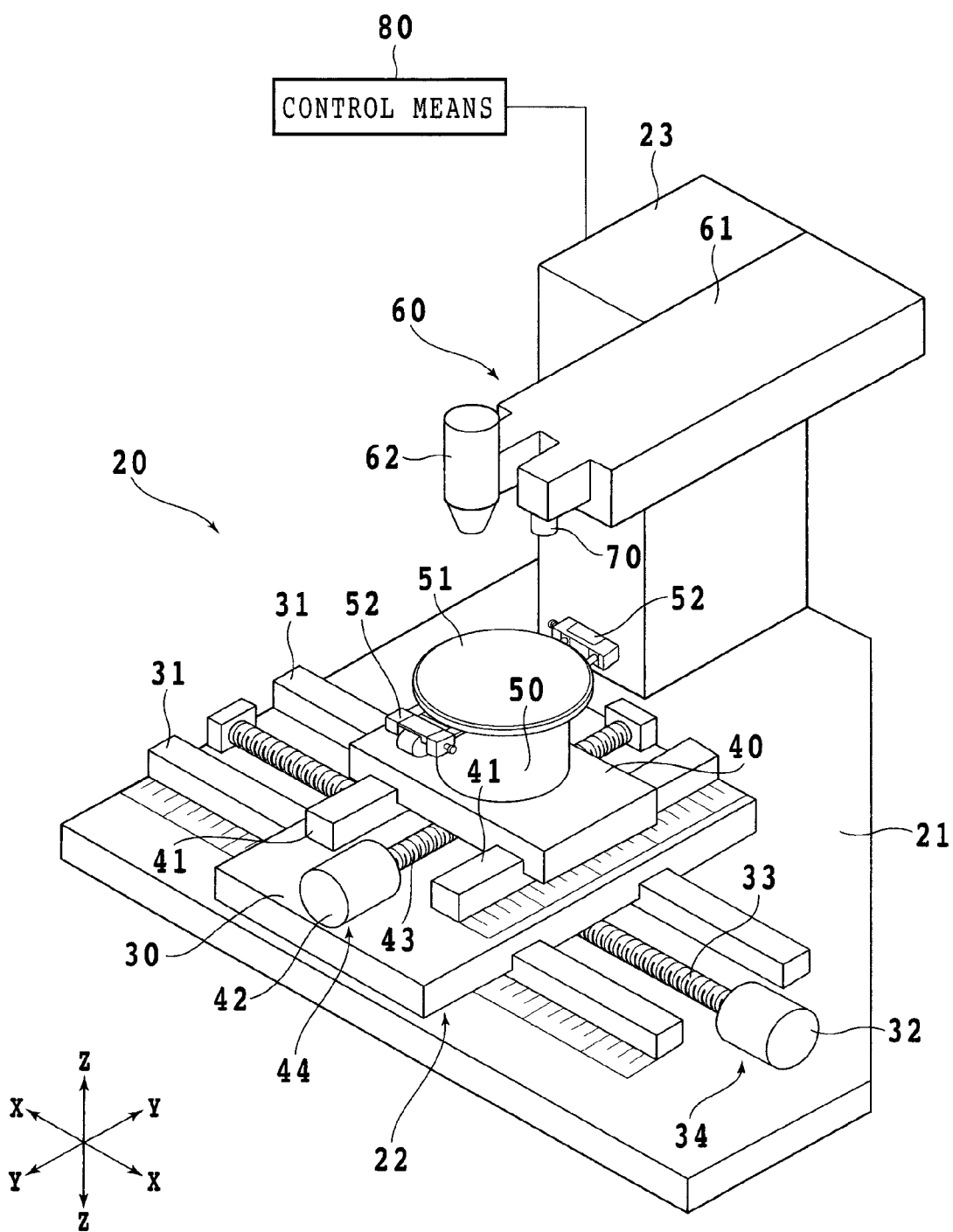
FIG. 3 is a perspective view of the laser processing apparatus preferably used in performing the method according to the preferred embodiment.

Reference numeral 21 in FIG. 3 denotes a base of the laser processing apparatus 20. An XY moving table 22 is provided on the base 21 so as to be movable both in the X direction and in the Y direction on a horizontal plane. A chuck table (holding means) 51 for holding the light emitting device wafer 1 is provided on the XY moving table 22. A laser beam applying portion 62 of laser processing means 60 for applying a laser beam toward the light emitting device wafer 1 held on the chuck table 51 is provided above the chuck table 51 so as to face the chuck table 51.

The XY moving table 22 is configured by combining an X-axis base 30 provided on the base 21 so as to be movable in the X direction and a Y-axis base 40 provided on the X-axis base 30 so as to be movable in the Y direction. A pair of parallel guide rails 31 extending in the X direction are fixed on the base 21, and the X-axis base 30 is slidably mounted on the guide rails 31. The X-axis base 30 is movable in the X direction by an X-axis driving mechanism 34 including a motor 32 and a ball screw 33 adapted to be rotated by the motor 32. Similarly, a pair of parallel guide rails 41 extending in the Y direction are fixed on the X-axis base 30, and the Y-axis base 40 is slidably mounted on the guide rails 41. The Y-axis base 40 is movable in the Y direction by a Y-axis driving mechanism 44 including a motor 42 and a ball screw 43 adapted to be rotated by the motor 42.

A cylindrical chuck base 50 is fixed to the upper surface of the Y-axis base 40. The chuck table 51 is supported on the chuck base 50 so as to be rotatable about an axis extending in the Z direction (vertical direction). The chuck table 51 is of a vacuum chuck type well known in the art such that the light emitting device wafer 1 as a workpiece is held on the chuck table 51 under suction by using suction means (not shown). The chuck table 51 is rotatable in one direction or in opposite directions by rotationally driving means (not shown) contained in the chuck base 50. A pair of clamps 52 for detachably holding the frame 11 are provided near the outer circumference of the chuck table 51 so as to be spaced 180° apart from each other. These clamps 52 are mounted on the chuck base 50.

In moving the X-axis base 30 of the XY moving table 22 in the X direction, a laser beam is applied along the division lines 9, i.e., a feeding operation is performed. In moving the Y-axis base 40 of the XY moving table 22 in the Y direction, the target division line 9 subjected to the laser processing is changed to another target division line 9, i.e., an indexing operation is performed. Thus, the operational direction (feeding direction) of the feeding operation is set to the X direction, and the operational direction (indexing direction) of the indexing operation is set to the Y direction in this preferred embodiment. As a modification, the feeding direction may be set to the Y direction, and the indexing direction may be set to the X direction.

The laser processing means 60 has a boxlike casing 61 extending in the Y direction to a position above the chuck table 51. The laser beam applying portion 62 is provided at the front end of the casing 61. A column 23 stands on the base 21, and the casing 61 is provided on the column 23 so as to be movable in the Z direction by vertically driving means (not shown) contained in the column 23.

The casing 61 contains pulsed laser beam oscillating means and laser beam power adjusting means for adjusting the power (pulse energy) of a laser beam oscillated by the pulsed laser beam oscillating means. The pulsed laser beam oscillating means and the laser beam power adjusting means constitute the laser processing means 60. The laser beam applying portion (focusing means) 62 of the laser processing means 60 is designed to downward apply a pulsed laser beam. The laser beam applying portion 62 includes a mirror for changing the traveling direction of the laser beam oscillated from the pulsed laser beam oscillating means to a downward direction and a focusing lens for focusing the laser beam reflected by this mirror.

Imaging means 70 is provided at the front end of the casing 61 at a position near the laser beam applying portion 62. The imaging means 70 functions to detect a laser beam applying area in the light emitting device wafer 1 to be irradiated with the laser beam applied by the laser beam applying portion 62 by imaging. The imaging means 70 includes illuminating means for illuminating the light emitting device wafer 1 held on the chuck table 51, an optical system for capturing light from the illuminating means, and an imaging device such as a CCD for outputting an electrical signal corresponding to the light captured by the optical system. Image information obtained by the imaging means 70 is supplied to control means 80.

The control means 80 functions to suitably control various operations including the rotation of the chuck table 51, the movement (feeding operation) of the X-axis base 30 by the X-axis driving mechanism 34, the movement (indexing operation) of the Y-axis base 40 by the Y-axis driving mechanism 44, and the application of the laser beam by the laser processing means 60 according to the image information supplied from the imaging means 70.

(2-2) Operation of Laser Processing Apparatus

There will now be described the operation of laser-processing the sapphire substrate layer 2A of the light emitting device wafer 1 by using the laser processing apparatus 20. This operation is automatically controlled by the control means 80, and includes the manufacturing method of the present invention.

(2-2-1) Holding Step for Light Emitting Device Wafer

Figure 4:
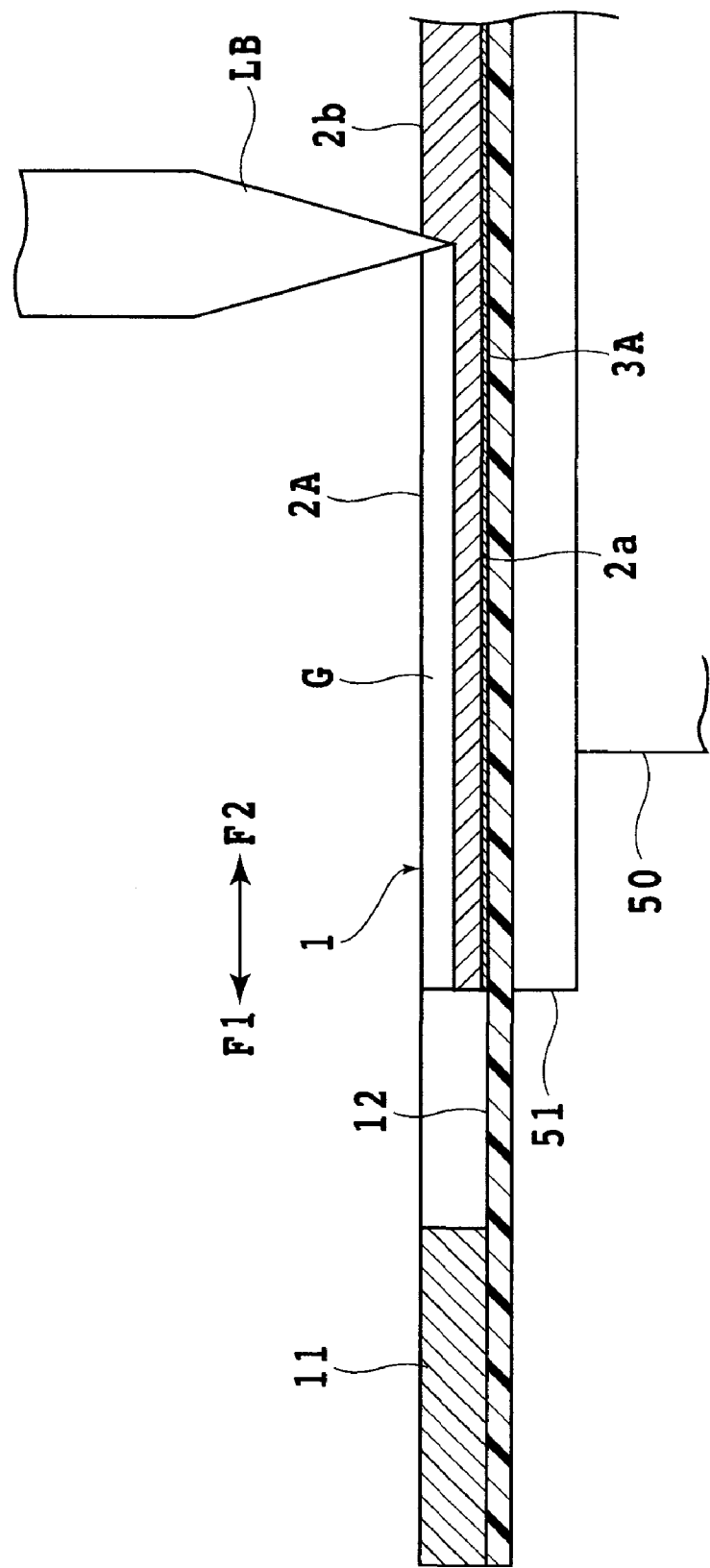
FIG. 4 is a sectional view showing an example of laser processing in the case of forming a groove on the exposed surface of a sapphire substrate layer of the wafer.

The suction means connected to the chuck table 51 is operated to produce a vacuum on the upper surface of the chuck table 51, and the light emitting device wafer 1 supported through the adhesive tape 12 to the frame 11 as shown in FIG. 2 is placed on the chuck table 51 in the condition where the light emitting layer 3A is opposed through the adhesive tape 12 to the upper surface of the chuck table 51 and the sapphire substrate layer 2A is exposed upward. Accordingly, as shown in FIG. 4, the light emitting layer 3A of the light emitting device wafer 1 is held under suction on the upper surface of the chuck table 51 through the adhesive tape 12. Further, the frame 11 is fixed by the clamps 52.

Thereafter, the XY moving table 22 is suitably moved in the X direction and the Y direction to thereby move the wafer 1 to a position directly below the imaging means 70. At this position, the imaging means 70 is operated to image the front surface of the light emitting layer 3A as transmitting light through the sapphire substrate layer 2A. Thereafter, the control means 80 performs an alignment operation according to the image information on the division lines 9 formed on the front surface of the light emitting layer 3A as supplied from the imaging means 70. That is, the chuck table 51 is rotated to make the division lines 9 along which a laser beam is to be irradiated extending in a first direction parallel to the feeding direction (X direction). As a result, the division lines 9 extending in the first direction on the wafer 1 become parallel to the feeding direction.

(2-2-2) Laser Processing Step

The X-axis base 30 is moved in the X direction to move the light emitting device wafer 1 to a standby position deviated from the laser beam applying portion 62 in the X direction. Further, the Y-axis base 40 is moved in the indexing direction (Y direction) to make the Y position of a predetermined one of the division lines 9 extending in the X direction coincide with the focal point of the laser beam to be applied from the laser beam applying portion 62. Further, the casing 61 is moved in the vertical direction (Z direction) to set the focal point of the laser beam to be applied from the laser beam applying portion 62 to a predetermined depth in the sapphire substrate layer 2A.

Thereafter, the X-axis base 30 is moved in the feeding direction to thereby locate the above predetermined division line 9 to a position directly below the laser beam applying portion 62, and the laser beam is applied from the laser beam applying portion 62 toward the sapphire substrate layer 2A. At this time, the direction of scanning of the laser beam is changed in the Y direction in such a manner that the laser beam follows a corrugated line along the predetermined division line 9. Changing the direction of scanning of the laser beam in this manner may be performed by any arbitrary method. For example, an acoustooptic device (AOD) may be used to change the direction of scanning of the laser beam itself. As another method, the angle of the mirror included in the laser beam applying portion 62 may be adjusted to change the angle of reflection of the laser beam. As still another method, the focusing lens in the laser beam applying portion 62 may be oscillated in the Y direction.

The laser processing along the division lines 9 formed on the light emitting layer 3A in this preferred embodiment is an operation for weakening the division lines 9. Examples of this weakening operation include an operation for forming a groove having a given depth on the exposed back surface 2b of the sapphire substrate layer 2A along each division line 9 and an operation for forming a weak modified layer inside the sapphire substrate layer 2A along each division line 9. The groove forming operation is shown in FIG. 4, wherein a laser beam LB is applied to the sapphire substrate layer 2A so that the focal point of the laser beam LB is set at a given depth from the back surface 2b of the sapphire substrate layer 2A. That is, ablation is performed to melt and evaporate the components of the sapphire substrate layer 2A, thereby forming a corrugated groove G along each division line 9.

Figure 5:
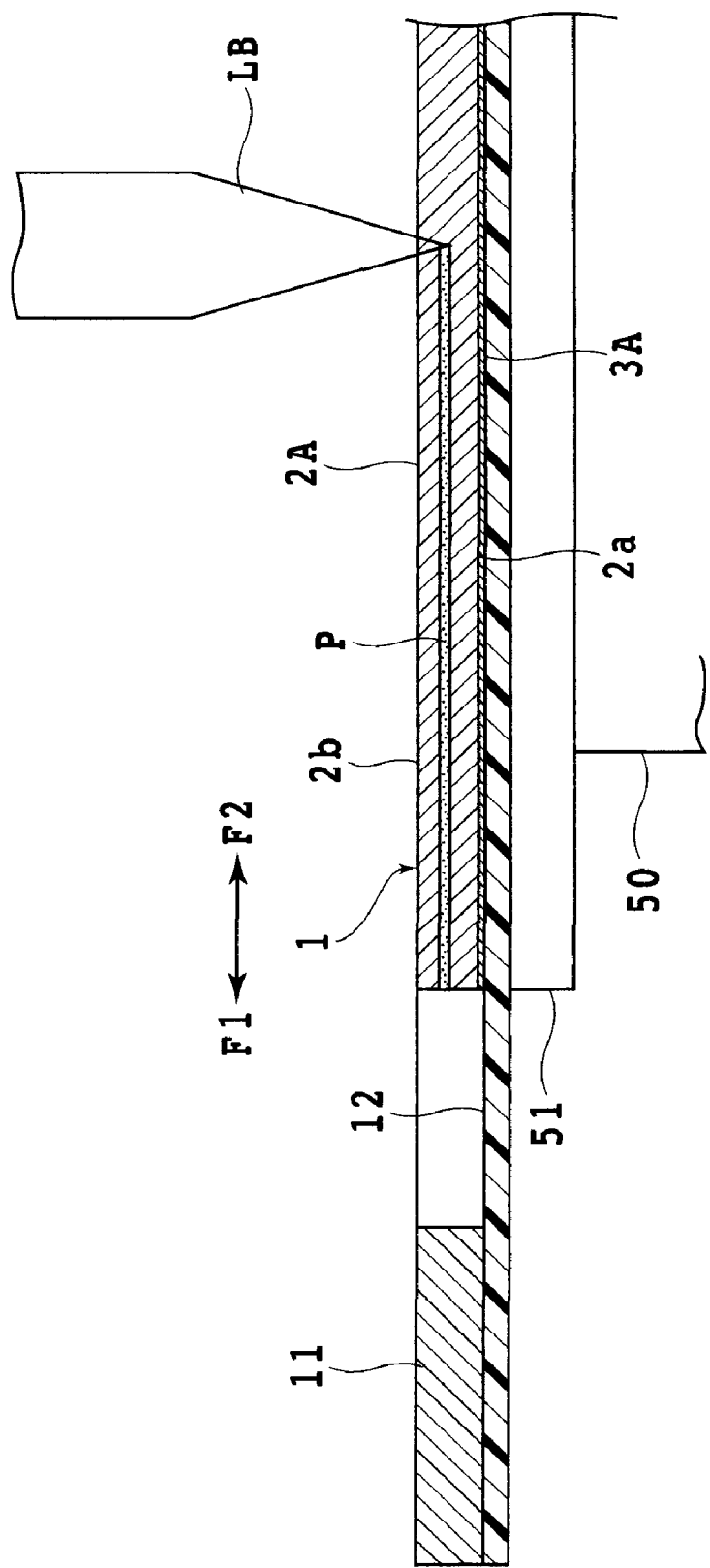
FIG. 5 is a sectional view showing another example of laser processing in the case of forming a modified layer in the sapphire substrate layer of the wafer.

On the other hand, the modified layer forming operation is shown in FIG. 5, wherein a laser beam LB having a transmission wavelength to the sapphire substrate layer 2A is applied to the sapphire substrate layer 2A so that the focal point of the laser beam LB is set inside the sapphire substrate layer 2A, thereby forming a corrugated modified layer P along each division line 9. The modified layer mentioned above means a region different from its ambient region in density, refractive index, mechanical strength, or any other physical properties. Examples of the modified layer include a melted region, cracked region, breakdown region, and refractive index changed region. These regions may be included separately or in a mixed condition.

In FIGS. 4 and 5, an arrow F1 indicates the direction of movement of the chuck table 51 and an arrow F2 indicates the direction of scanning of the laser beam LB. Further, in FIGS. 4 and 5, the groove G and the modified layer P are linearly shown so as to extend in the direction of the arrow F2. However, in actual, the direction of scanning of the laser beam LB meanders so as to alternately change in the direction (Y direction) perpendicular to the sheet plane of FIG. 4 or 5. Accordingly, the groove G or the modified layer P is corrugated so as to alternately convex and concave in the direction (Y direction) perpendicular to the sheet plane of FIG. 4 or 5.

After performing the laser processing so as to form a corrugated shape along the predetermined division line 9, the Y-axis base 40 is moved in the indexing direction to make the Y position of the next division line 9 adjacent to the previous division line 9 (already subjected to the laser processing) coincide with the focal point of the laser beam. Thereafter, the light emitting device wafer 1 is moved in the feeding direction, and the laser beam is applied to the wafer 1 so as to form a corrugated shape along this indexed division line 9 in a similar manner. In this manner, the feeding operation for applying the laser beam along the indexed division line 9 so as to form a corrugated shape and the indexing operation for determining the laser beam applying position in the Y direction are alternately repeated to thereby scan the laser beam along all of the division lines 9 extending in the first direction parallel to the X direction.

Figure 6A:
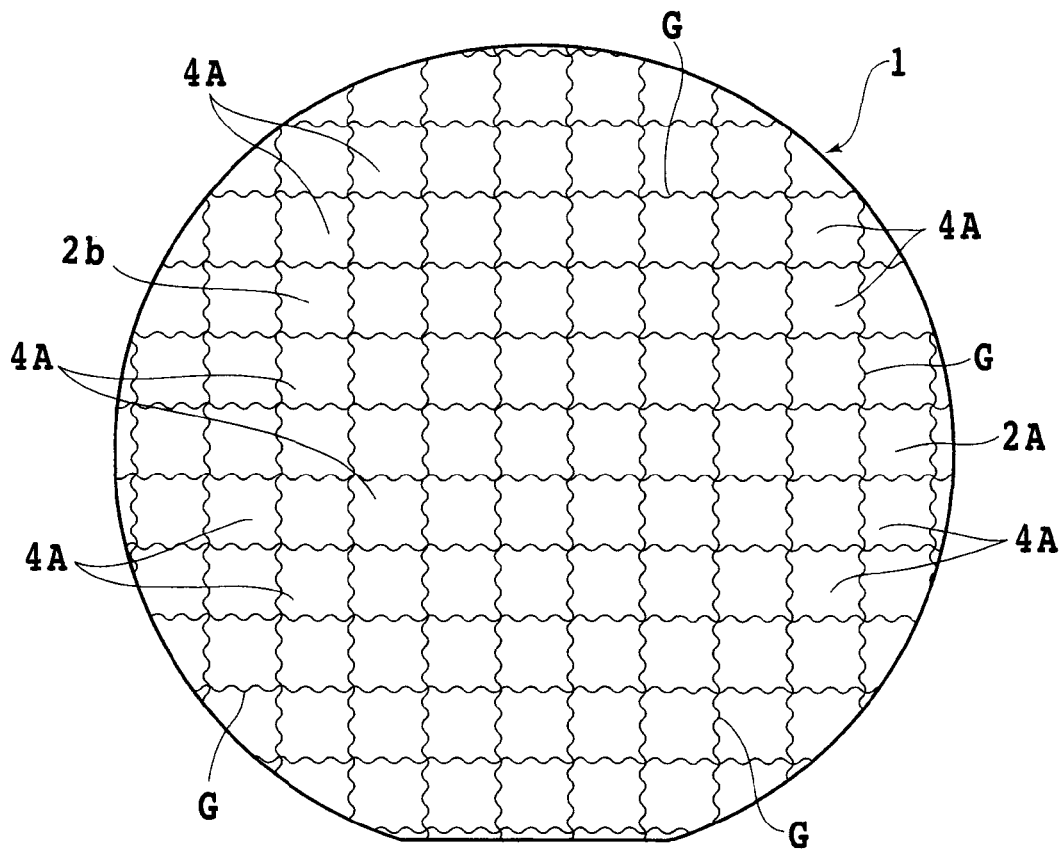
FIG. 6A is a plan view of the light emitting device wafer in the condition where a corrugated groove is formed on the sapphire substrate layer of the wafer along each division line by the laser processing.
Figure 6B:
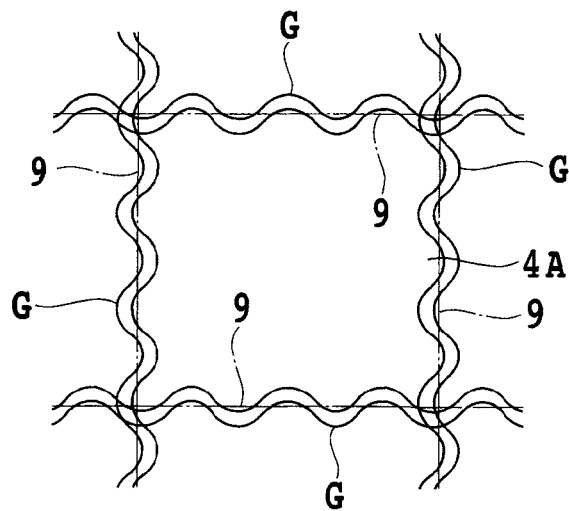
FIG. 6B is an enlarged plan view of a part of the light emitting device wafer shown in FIG. 6A.

Thereafter, the chuck table 51 is rotated 90° to make the other division lines 9 extending in a second direction perpendicular to the first direction parallel to the X direction. That is, an alignment operation for making the other division lines 9 parallel to the X direction is performed. Thereafter, as in the laser processing for the division lines 9 extending in the first direction mentioned above, the laser beam is corrugatedly applied along all of the division lines 9 extending in the second direction. As a result, the laser processing is performed along all of the crossing division lines 9 extending in the first and second directions so as to form a corrugated shape as shown in FIG. 6A. FIG. 6A shows a plurality of corrugated grooves G (each shown in FIG. 4) formed on the exposed surface (back surface 2b) of the sapphire substrate layer 2A. As shown in FIG. 6B, each groove G meanders so as to weave the corresponding division line 9.

(3) Dividing Step

By performing the laser processing for the sapphire substrate layer 2A along the division lines 9 so as to form a corrugated shape as mentioned above, each light emitting device area 4A of the sapphire substrate layer 2A is surrounded by the corrugated locus formed by the laser processing (i.e., the grooves G shown in FIG. 4 or the modified layers P shown in FIG. 5). Thereafter, an external force is applied to the corrugated locus along the division lines 9, thereby breaking the light emitting device wafer 1 along the corrugated locus. As a result, each light emitting device area 4A is brought into a light emitting device 4 shown in FIGS. 8A to 8C. That is, the light emitting device wafer 1 is divided into a plurality of light emitting devices 4 in the form of chips.

As a method of applying an external force to the corrugated locus formed by the laser processing along the division lines 9, a method of radially outward expanding the adhesive tape 12 is preferably adopted. This method may be performed by using an expanding apparatus disclosed in Japanese Patent Laid-open Nos. 2007-27250 and 2008-140874, for example. As another method, an external force may be applied so as to bend the light emitting device wafer 1 along the corrugated locus, thereby dividing the wafer 1.

Figure 7:
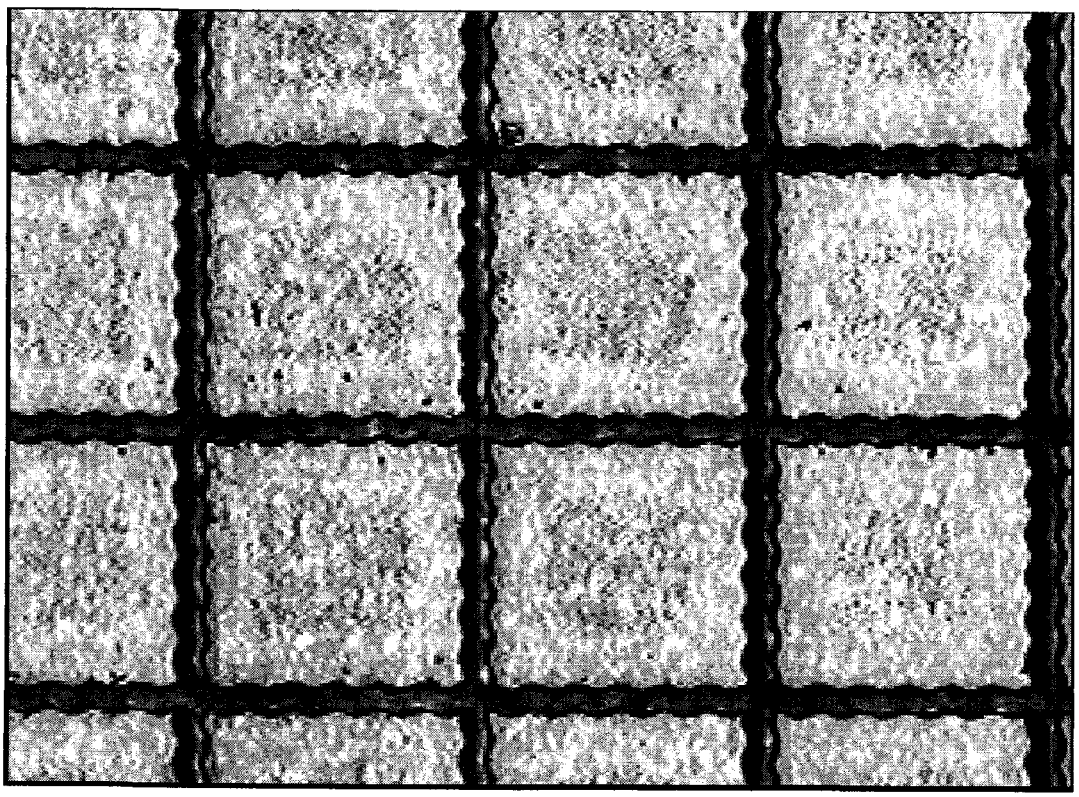
FIG. 7 is a photograph showing a part of the light emitting device wafer in the condition where the adhesive tape is expanded to divide the wafer along each division line after forming the corrugated groove along each division line by the laser processing.

FIG. 7 shows an example of the light emitting device wafer divided by expanding the adhesive tape after forming the corrugated grooves along the division lines. In this example, each light emitting device area is square, wherein the groove forming each side of this square area has a corrugated shape having about ten corrugations, for example, and each side of this square area has a length of about 0.3 mm, for example.

(4) Light Emitting Device

The light emitting device 4 obtained by dividing the light emitting device wafer 1 as mentioned above will now be described.

(4-1) Configuration of Light Emitting Device

Figure 8A:
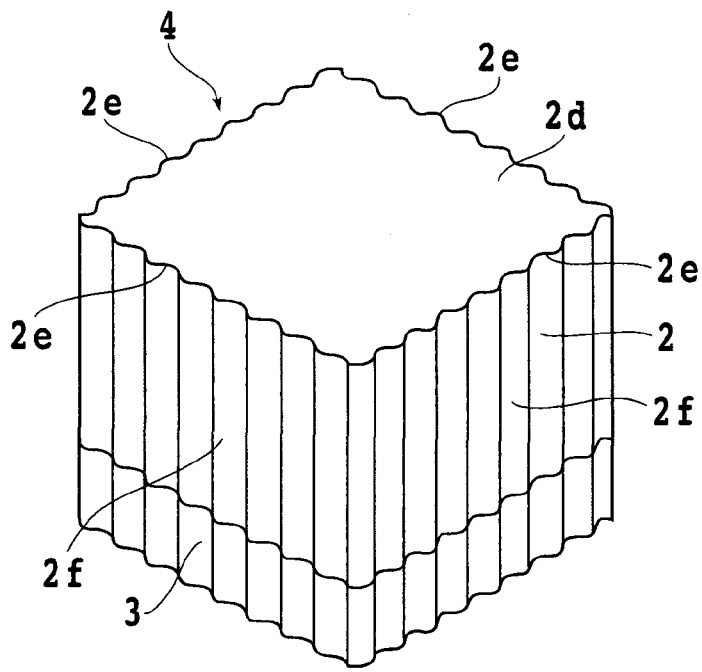
FIG. 8A is a schematic perspective view of each light emitting device manufactured by the method according to the preferred embodiment of the present invention.
Figure 8B:
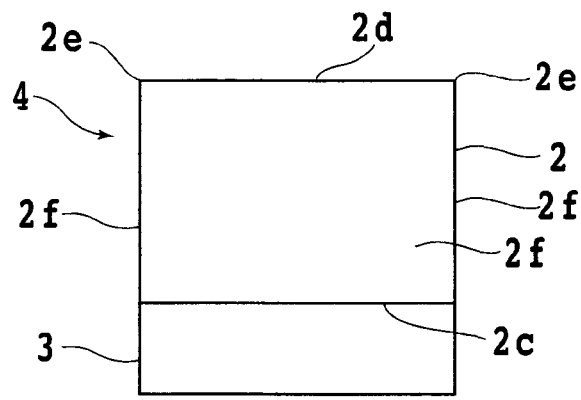
FIG. 8B is a side view of the light emitting device shown in FIG. 8A.
Figure 8C:
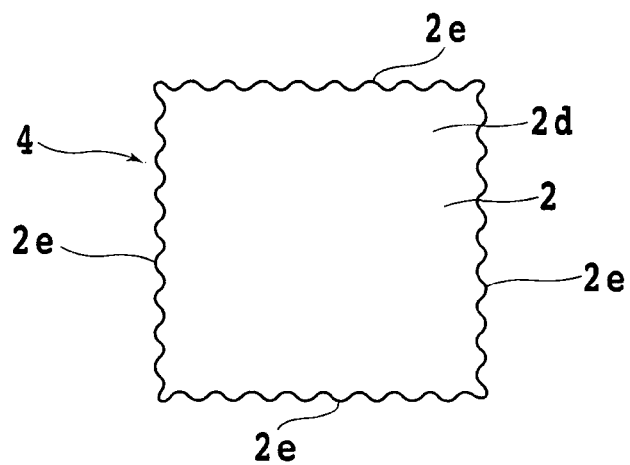
FIG. 8C is a plan view of the light emitting device shown in FIG. 8A as viewed from the side of the sapphire layer.

FIG. 8A is a perspective view of the light emitting device 4, FIG. 8B is a side view of the light emitting device 4, and FIG. 8C is a plan view of the light emitting device 4. As shown in FIGS. 8A to 8C, the light emitting device 4 is composed of a sapphire layer 2 having a front surface (lower surface as viewed in FIGS. 8A and 8B) 2c and a back surface 2d and a light emitting layer 3 formed on the front surface 2c of the sapphire layer 2. The sapphire layer 2 is obtained by dividing the sapphire substrate layer 2A of the wafer 1 along the division lines 9, and the light emitting layer 3 is obtained by dividing the light emitting layer 3A of the wafer 1 along the division lines 9. As shown in FIG. 8C, the light emitting device 4 has a substantially square shape as viewed in plan in the direction of lamination of the sapphire layer 2 and the light emitting layer 3. However, each side of the substantially square shape is not a straight line, but a corrugated line corresponding to the corrugated locus formed by the laser processing. The front surface 2c and the back surface 2d of the sapphire layer 2 have substantially square shapes of the same size, and four side surfaces 2f (2f-1 to 2f-4 shown in FIG. 9) are formed between the front surface 2c and the back surface 2d so as to extend from the four sides 2e of the substantially square back surface 2d to the light emitting layer 3. The light emitting layer 3 having the same horizontal sectional shape as that of the sapphire layer 2 is formed on the front surface 2c of the sapphire layer 2. According to this light emitting device 4, light emitted from the light emitting layer 3 is transmitted through the sapphire layer 2 and then emerges from the back surface 2d and each side surface 2f to the outside of the sapphire layer 2 (e.g., to the ambient air).

(4-2) Operation and Effect of Light Emitting Device

Figure 9:
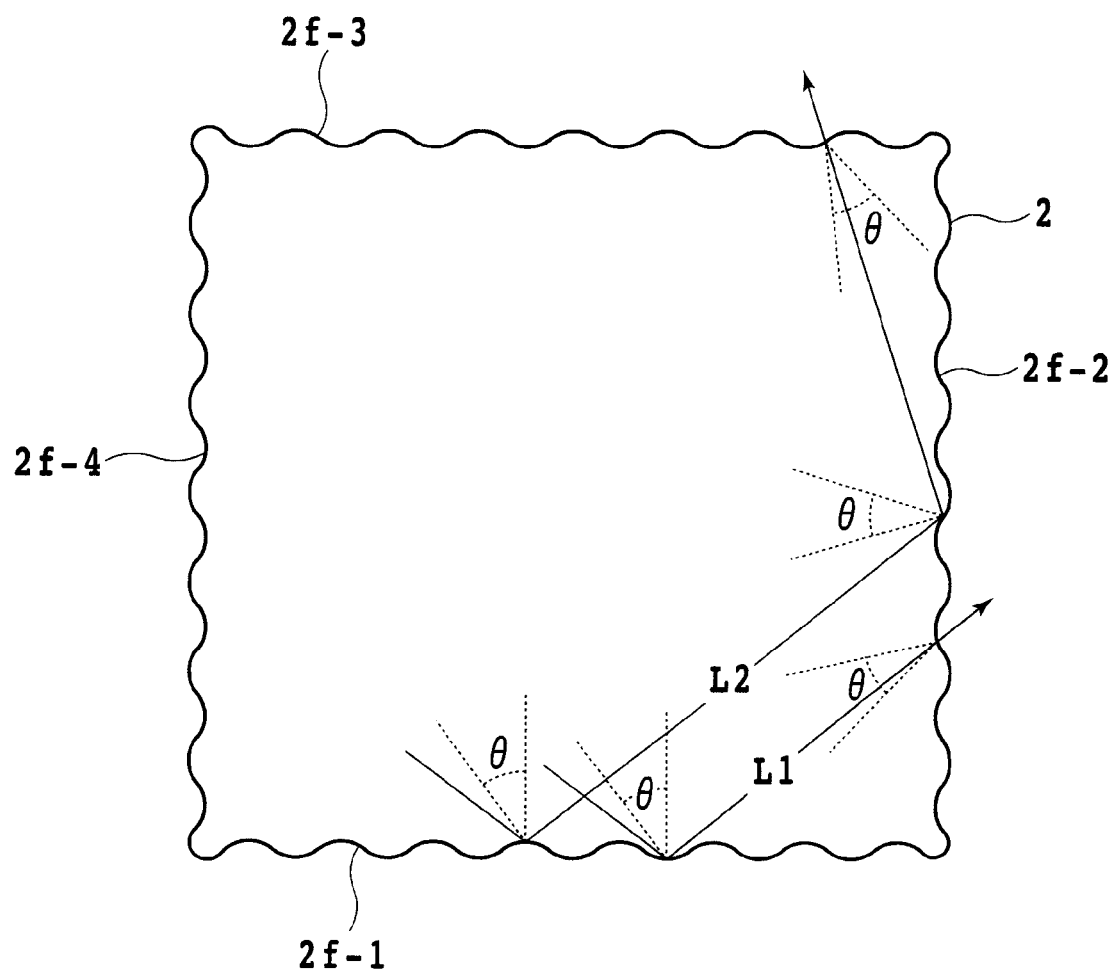
FIG. 9 is a schematic sectional view showing a condition that light is passed through the corrugated side surfaces of the sapphire layer of the light emitting device of the embodiment.

As shown in FIG. 9, the sapphire layer 2 of the light emitting device 4 in this preferred embodiment is surrounded by the four side surfaces 2f. These side surfaces 2f are cut surfaces obtained by cutting the wafer 1 along the corrugated locus mentioned above. Accordingly, the horizontal sectional shape of these side surfaces 2f is a corrugated shape corresponding to the corrugated locus, so that the quantity of light emerging from the sapphire layer 2 can be increased.

Figure 10:
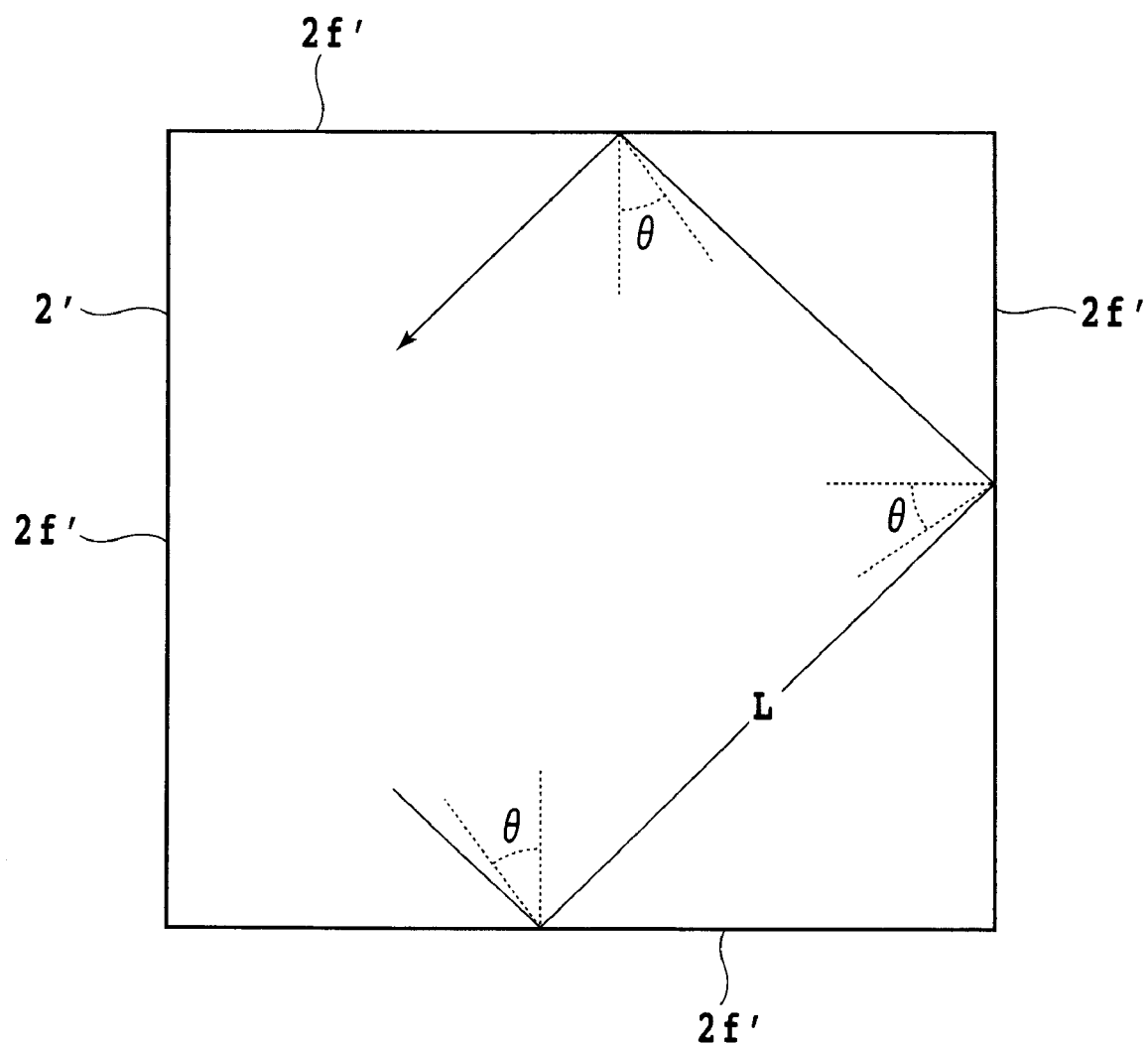
FIG. 10 is a schematic sectional view showing a condition that light is totally reflected on the flat side surfaces of a conventional light emitting device.

The reason for this effect will now be described. FIG. 10 shows a sapphire layer 2' whose horizontal sectional shape is square, wherein each side is a straight line. In the case that light L in the sapphire layer 2' is incident on a side surface 2f', the critical angle θ allowing the light L to pass through the side surface 2f' to the outside of the sapphire layer 2', e.g., to pass through the interface between the sapphire layer 2' and the air to the air, is a relatively small angle of about 34.5° according to the refractive indices of the sapphire layer 2' and the air. The critical angle θ is defined as an angle formed between the ray of the light L and the normal to the interface. When the light L is incident on the side surface 2f' at an incident angle less than or equal to this critical angle θ, the light L is allowed to pass through the side surface 2f'. However, when the light L is incident on the side surface 2f' at an incident angle greater than the critical angle θ, the light L is totally reflected on the side surface 2f'. Thereafter, the total reflection is repeated on the other side surfaces 2f' to finally disappear in the sapphire layer 2'.

In contrast, each side surface 2f of the sapphire layer 2 shown in FIG. 9 according to this preferred embodiment has a corrugated shape, so that light L1 incident on one side surface 2f-1 at an incident angle greater than the critical angle θ is totally reflected on the side surface 2f-1 and next enters another side surface 2f-2 at an incident angle less than the critical angle θ to pass through the side surface 2f-2. Further, light L2 incident on the side surface 2f-1 at an incident angle greater than the critical angle θ at a different position is also totally reflected on the side surface 2f-1 and next enters the side surface 2f-2 at an incident angle greater than the critical angle θ to totally reflect on the side surface 2f-2. The light L2 totally reflected on the side surface 2f-2 next enters another side surface 2f-3 at an incident angle less than the critical angle θ to pass through the side surface 2f-3.

As described above, according to the light emitting device 4 in this preferred embodiment, although the incident angle of light incident on one side surface 2f in the sapphire layer 2 is greater than the critical angle θ to cause the total reflection on this side surface 2f, the incident angle of the totally reflected light next incident on another side surface 2f or further next incident on another side surface 2f tends to become less than the critical angle θ. Accordingly, the repetition of the total reflection on the side surfaces 2f of the sapphire layer 2 can be reduced. As a result, the quantity of light emerging from the sapphire layer 2 can be increased and the light can efficiently emerge from the sapphire layer 2, thereby exhibiting a high luminance performance.

Figure 11:
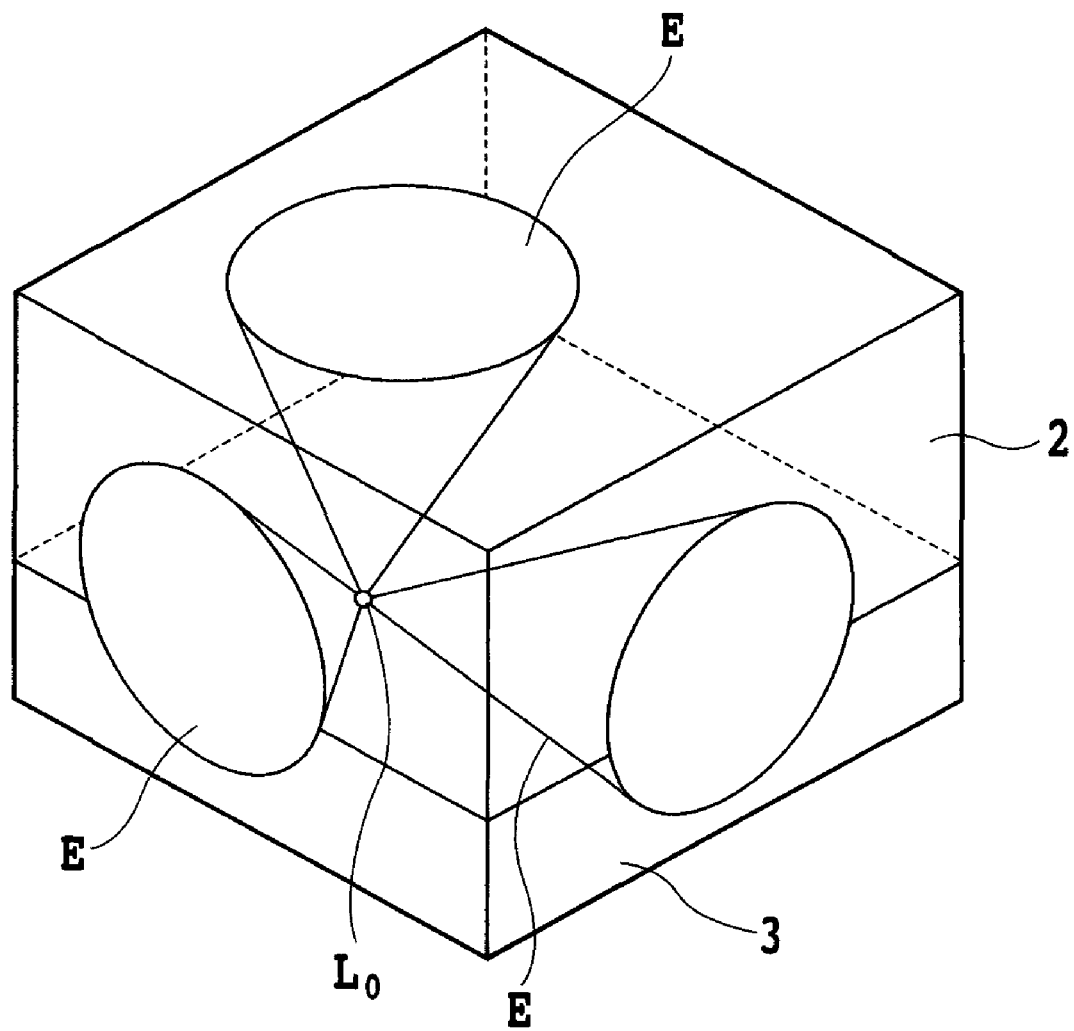
FIG. 11 is a schematic perspective view of a conventional light emitting device for illustration of an escape cone.

In other words, as shown in FIG. 11, light emitted from a certain light emitting point $L_0$ is required to travel in an area generally called an escape cone E and then emerge from the sapphire layer 2. This escape cone E shows an area where the light emitted from the light emitting point $L_0$ can pass through the interface between the sapphire layer 2 and the layer adjacent to the sapphire layer 2. According to the present invention, the sectional shape of each side surface of the sapphire layer 2 is a corrugated shape (or zigzag shape), so that it is considered that the escape cone E can be enlarged.

(5) Modifications

Figure 12:
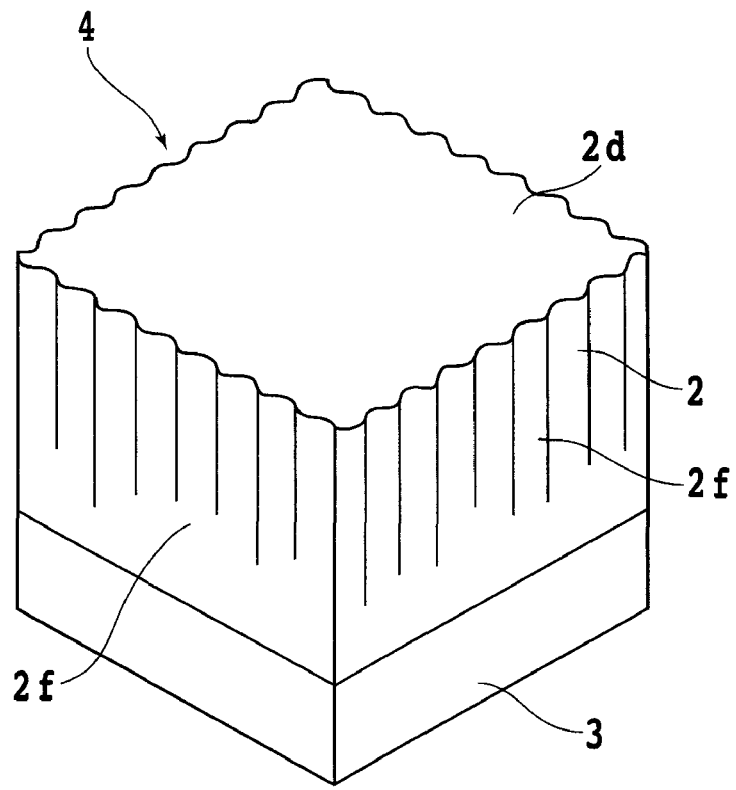
FIG. 12 is a schematic perspective view showing a modification of the light emitting device of the embodiment, wherein each side surface of the sapphire layer is a partially corrugated surface.

In the light emitting device 4 shown in FIGS. 8A to 8C according to the above preferred embodiment, each side surface of the device 4 is entirely formed as a corrugated surface from the upper end surface of the sapphire layer 2 to the lower end surface of the light emitting layer 3 as viewed in FIG. 8B. However, each side surface of the device 4 is not always entirely corrugated depending upon the circumstances of division of the light emitting device wafer 1 in the dividing step. For example, as shown in FIG. 12, there is a case that each side surface 2f of the sapphire layer 2 is partially corrugated from the upper end surface (the back surface 2d) of the sapphire layer 2 to an intermediate position between the upper end surface to the lower end surface of the sapphire layer 2 and that the other part of each side surface of the device 4 is a flat surface from this intermediate position of the sapphire layer 2 to the lower end surface of the light emitting layer 3. Thus, each side surface 2f of the sapphire layer 2 may be formed as a partially corrugated or zigzag surface.

Figure 13:
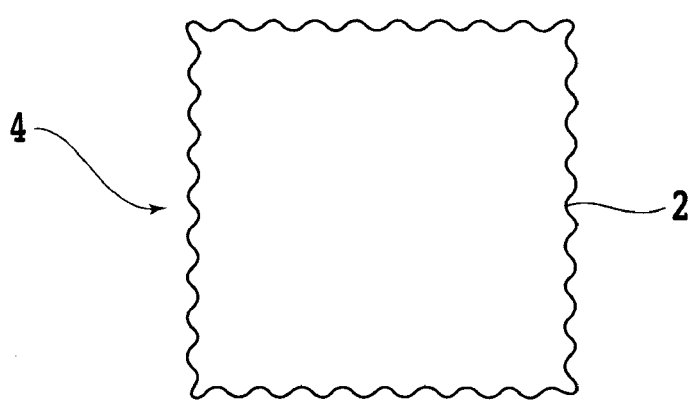
FIG. 13 is a plan view showing another modification of the light emitting device shown in FIGS. 8A to 8C, wherein each side surface of the sapphire layer is a zigzag surface.

In the above preferred embodiment, the processed locus formed by the laser processing is a corrugated locus as a continuous curved line. However, the processed locus in the present invention may include a zigzag locus formed by repeatedly bending a straight line. In this case, the light emitting device 4 obtained by dividing the light emitting device wafer 1 becomes a light emitting device 4 shown in FIG. 13, wherein each side surface of the sapphire layer 2 is formed as a zigzag surface.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a plurality of light emitting devices from a light emitting device wafer having a sapphire substrate layer and a light emitting layer by using a laser processing apparatus having holding means for holding said light emitting device wafer and laser processing means for applying a laser beam to said light emitting device wafer held by said holding means to perform laser processing, said method comprising:

a holding step of holding said light emitting device wafer by using said holding means in the condition where said light emitting layer of said light emitting device wafer is set on said holding means and said sapphire substrate layer of said light emitting device wafer is exposed;

a laser processing step of scanning said laser beam, in a meandering path, along a plurality of division lines formed on said light emitting device wafer from the exposed side of said sapphire substrate layer so as to form a corrugated or zigzag shape along said division lines, thereby performing said laser processing; and a dividing step of applying an external force to a processed locus formed along each division line by said laser processing, thereby dividing said light emitting device wafer into said light emitting devices;

wherein at least one side surface of said light emitting devices has a partially or entirely corrugated or zigzag shape.

* * * * *